United States Patent
Bhangu et al.

(10) Patent No.: US 9,035,689 B2
(45) Date of Patent: May 19, 2015

(54) THERMAL CONTROLLER FOR SEMICONDUCTOR SWITCHING POWER DEVICES

(71) Applicant: ROLLS-ROYCE PLC, London (GB)

(72) Inventors: Bikramjit Bhangu, Singapore (SG); Mohamed Halick Mohamed Sathik, Singapore (SG); Sivakumar Nadarajan, Singapore (SG); Chandana Jayampathi Gajanayake, Singapore (SG)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 14/167,088

(22) Filed: Jan. 29, 2014

(65) Prior Publication Data
US 2014/0225659 A1    Aug. 14, 2014

(30) Foreign Application Priority Data

Feb. 12, 2013  (GB) ................................. 1302407.0
Oct. 3, 2013   (GB) ................................. 1317490.9

(51) Int. Cl.
*H03K 17/14* (2006.01)
*G01K 7/00* (2006.01)

(52) U.S. Cl.
CPC ...... *H03K 17/145* (2013.01); *H01L 2924/0002* (2013.01)

(58) Field of Classification Search
CPC ....................... H03K 17/145; H01L 2924/0002
USPC .................................... 327/378, 513; 374/178
See application file for complete search history.

(56) References Cited

U.S. PATENT DOCUMENTS

| | | | |
|---|---|---|---|
| 6,967,519 B2* | 11/2005 | Nakayama et al. | 327/380 |
| 7,254,000 B1* | 8/2007 | Smith et al. | 361/56 |
| 2004/0120090 A1 | 6/2004 | Galli et al. | |
| 2007/0004054 A1 | 1/2007 | Orr | |
| 2008/0238520 A1 | 10/2008 | de Rooij et al. | |
| 2009/0051307 A1 | 2/2009 | Katsuyama et al. | |
| 2010/0046123 A1 | 2/2010 | Fukami | |
| 2010/0080024 A1 | 4/2010 | Wei et al. | |
| 2011/0050324 A1* | 3/2011 | Jacobson | 327/513 |
| 2012/0248864 A1 | 10/2012 | Ioannidis et al. | |

FOREIGN PATENT DOCUMENTS

GB     2 315 172 A       1/1998
WO   WO 2012/042324 A1  4/2012

OTHER PUBLICATIONS

Jul. 24, 2013 Search Report issued in United Kingdom Patent Application No. GB1302407.0.
Mar. 27, 2014 Search Report issued in United Kingdom Patent Application No. GB1317490.9.

* cited by examiner

*Primary Examiner* — Kenneth Wells
(74) *Attorney, Agent, or Firm* — Oliff PLC

(57) ABSTRACT

A thermal controller for driving a gate control unit of a gate-driven semiconductor switching device, the thermal controller comprising a junction temperature estimation module for generating an estimated junction temperature for the switching device, a gate voltage control module for modifying a gate voltage of the switching device, a switching frequency control module for modifying a switching frequency of the switching device, and a duty cycle control module for modifying the duty cycle of the switching device. In use, the thermal controller is adapted to activate one of the gate voltage control module, switching frequency control module and duty cycle control module dependent upon the estimated junction temperature in order to maintain the actual junction temperature below a pre-determined limit.

2 Claims, 10 Drawing Sheets

THERMAL CONTROLLER FOR SEMICONDUCTOR SWITCHING POWER DEVICES

This invention claims the benefit of UK Patent Application No. 1317490.9, filed on 3 Oct. 2013, and UK Patent Application No. 1302407.0 filed on 12 Feb. 2013, each of which is hereby incorporated herein in its entirety.

FIELD OF THE INVENTION

The present invention relates to a controller for an electrical switching device and particularly, but not exclusively, to a thermal controller for a semiconductor switching device.

BACKGROUND TO THE INVENTION

Many electrical loads ranging from laptop to high power motor drives are powered by power electronic converters using power switching devices such as Insulated Gate Bipolar Junction Transistors (IGBT) or Metal Oxide Substrate Field Effect Transistors (MOSFET). There is an increasing requirement to improve the reliability and availability of such electrical systems, in particular by the prevention of power switching device failures.

Two common causes of power switching device failure are electrical faults and thermal stresses. Electrical faults are typically caused by exposure of the switching device to over-voltage, over-current, high rate of change of voltage or high rate of change of current conditions. Enhanced design of the gate drive circuits using de-saturation protection is generally employed to detect electrical stresses, with the gate drive circuit being arranged to rapidly reduce the gate-voltage for safe shutdown of the switching device.

Thermal stresses are generally caused by the exposure of the switching device to high currents over extended periods, high current transient spikes and long exposure to thermal cycling. Many known gate drive circuits do not consider the temperature of the switching device or its case as part of the control strategy.

Traditionally, the function of the gate driver is to apply the correct switching signals to the switching device (for example, IGBT, MOSFET devices etc.). It also provides protective features such as the ability to shut down upon detection of excessive current, voltages or device failures. Today, there are some active gate control driver topologies available in the market but their focus is limited to safe shutdown and slope control of a switching signal to reduce the electrical stress.

A known problem with existing gate drive circuits is that a single point failure or the failure of single switching device will result in the complete shutdown of the system. This is a concern in safely critical applications where system shutdown may be unacceptable. In such applications redundant systems may be employed to meet the reliability requirements. However, this generally results in a complex and expensive architecture, which requires additional hardware and control, impacting system power density.

Device over sizing may offer increased margins for the maximum current handling but will result in the design of an over sized heat sink and cooling system. Although such a solution is able to dissipate the generated heat, the system cost and weight will increase.

Statements of Invention

According to a first aspect of the present invention there is provided a thermal controller for driving a gate control unit of a gate-driven semiconductor switching device, the thermal controller comprising:

a junction temperature estimation module for generating an estimated junction temperature for the switching device;

a voltage control module for modifying a gate voltage of the switching device;

a switching frequency control module for modifying a switching frequency of the switching device; and a duty cycle control module for modifying the duty cycle of the switching device, wherein, in use, the thermal controller is adapted to activate one or more of the gate voltage control module, switching frequency control module and duty cycle control module dependent upon the estimated junction temperature.

The thermal controller of the present invention manages the thermal stress of the power device by actively controlling the device junction temperature. The solution offers increased reliability and increased utilization of silicon thermal capacity by providing sustained operation, even under maximum performance limits.

Optionally, the estimated junction temperature comprises the summation of a case temperature of the switching device, and a product of a power loss parameter for the switching device and a thermal impedance of the switching device.

It is known that the junction temperature is a key parameter for the correct operation of a gate-driven semiconductor switching device. However, it is impractical to directly measure the junction temperature of such a switching device in a production scenario.

The thermal controller of the present invention uses an algorithm to estimate the junction temperature and thus more efficiently determine a control strategy for the switching device that ensures that the junction temperature is kept within the set limits that enable its efficient operation.

This enables the thermal controller of the present invention to provide increased availability of the switching device when operated in arduous conditions.

Optionally, the power loss parameter comprises a function of:

the magnitude of the collector-emitter voltage of the switching device;

the magnitude of the supply current of the switching device;

the magnitude of the supply switching frequency of the switching device; and the magnitude of the duty ratio of the switching device.

Accurate power loss determination is important for determining the junction temperature of the switching device. The calculation method used to determine power loss will be dependent upon the configuration of the power circuit.

In general terms, the power loss has two components; switching loss and conduction loss. These components themselves depend on, for example, turn-on voltage, device current, turn-on resistance, switching frequency, and duty ratio.

Optionally, the gate voltage of the switching device is a gate-emitter voltage of the switching device.

Optionally, a turn-on voltage of the switching device is a collector-emitter voltage of the switching device.

Turn-on voltage, or collector-emitter voltage, when the device is in an 'ON' state may be used to determine power loss.

Optionally, a device current of the switching device is a collector-emitter current of the switching device.

Measurement of the magnitude of the collector-emitter voltage and device current signals provides the thermal controller with data representative of the operating condition of the switching device.

Optionally, the gate voltage of the switching device is preferably within the range of 10 to 18 volts, and more preferably is approximately 15 volts.

The selection of gate voltage may be made to allow for fast turn-on and turn-off of the device.

Optionally, the switching frequency of the switching device is preferably within the range of 2.5 to 7.5 kHz, and more preferably is approximately 5 kHz.

In other arrangements, the switching frequency of the switching device may be greater than 7.5 kHz, and may be up to 40 kHz or greater.

The choice of switching frequency may be determined by the specific application and the associated power level of the switching device. In particular, increasing the switching frequency may allow the size of passive components such as inductor and capacitor used for filtering to be reduced. However, when the device is operated at a high switching frequency, the switching losses may increase. Consequently, the final selection of switching frequency requires consideration of a number of criteria.

According to a second aspect of the present invention there is provided a method of controlling an operating characteristic of a switching device, the method comprising the steps of:
transmitting a drive signal to the gate of the switching device to thereby operate the switching device;
measuring at least one parameter that is representative of the operating condition of the switching device;
using the at least one parameter to generate a control signal; and
controlling the operating characteristic of the switching device by modifying the drive signal in response to the control signal.

The method of the present invention considers identifying and controlling appropriate factors (controllable parameters) to ease the power loss, whilst delivering the demanded output power. The key controllable parameters that the invention uses are gate voltage, switching frequency and duty ratio.

Optionally, the step of:
measuring at least one parameter that is representative of the operating condition of the switching device;
comprises the step of:
measuring a collector-emitter voltage, a supply current, a and a case temperature of the switching device; and
the step of:
using the at least one parameter to generate a control signal; comprises the steps of:
generating a calculated junction temperature for the switching device from the measured collector-emitter voltage, supply current, switching frequency and case temperature of the switching device; and
using the calculated gate junction temperature of the switching device to generate a control signal.

In addition to collector-emitter voltage, supply current and acse temperature of the switching device, other parameters may be used to further refine the calculated junction temperature for the switching device.

Optionally, the step of:
using the calculated junction temperature of the switching device to generate a control signal;
comprises the steps of:
generating a first control signal if the calculated junction temperature of the switching device is higher than a first reference temperature and lower than a second reference temperature;
generating a second control signal if the calculated junction temperature of the switching device is higher than the second reference temperature and lower than a third reference temperature; and
generating a third control signal if the calculated junction temperature of the switching device is higher than the third reference temperature;

Optionally, the step of:
controlling the operating characteristic of the switching device by modifying the drive signal in response to the control signal;
comprises the steps of:
activating a gate voltage controller to reduce the power loss in the switching device in response to the first control signal;
activating a frequency controller to reduce the power loss in the switching device in response to the second control signal; and
activating a duty cycle controller to reduce the average current supplied to the switching device in response to the third control signal.

Other aspects of the invention provide devices, methods and systems which include and/or implement some or all of the actions described herein. The illustrative aspects of the invention are designed to solve one or more of the problems herein described and/or one or more other problems not discussed.

BRIEF DESCRIPTION OF THE DRAWINGS

There now follows a description of an embodiment of the invention, by way of non-limiting example, with reference being made to the accompanying drawings in which.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION

Figure 1:
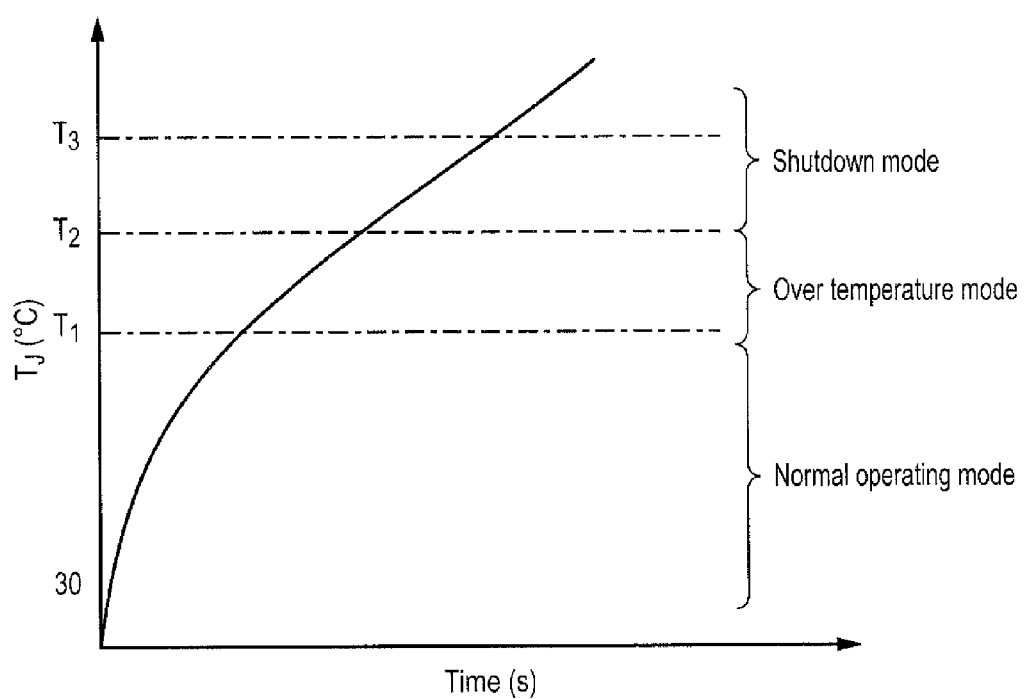
FIG. 1 shows a typical junction temperature characteristic for a gate-driven semiconductor switching device showing the three operating modes of a thermal controller according to an embodiment of the invention.

Referring to FIGS. 1 to 4, a thermal controller according to a first embodiment of the invention is designated generally by the reference numeral 100.

This thermal controller 100 comprises a junction temperature estimation module 110, a gate voltage control module 120, a switching frequency control module 130 and a duty cycle control module 140.

The thermal controller 100 receives signal inputs from sensors (not shown) that measure various operational parameters relating to the operation of the semiconductor switching device 150. These parameters include the case temperature of the switching device 150, the switching device collector-emitter voltage, the switching device supply current, and the switching frequency of the switching device 150.

The thermal controller 100 transmits a control signal to a gate control unit 160. The gate control unit 160 then transmits a drive signal to the switching device 150.

The control strategy of the thermal controller 100 is reliant on the availability of the junction temperature of the switching device 150. Since the junction temperature is not a readily measurable parameter, the junction temperature estimation module 110 estimates the junction temperature using a dynamic thermal model, as shown in FIG. 2.

The junction temperature estimation module 110 receives measured values of voltage and current, together with data sheet information of the switching device 150, to calculate the power loss (conduction loss, and switching loss) within the switching device 150 at each sampling interval. The estimated power loss and case temperature of the switching device 150 are used as inputs to the dynamic thermal model of switching device 150 from which the junction temperature is estimated.

Figure 5:
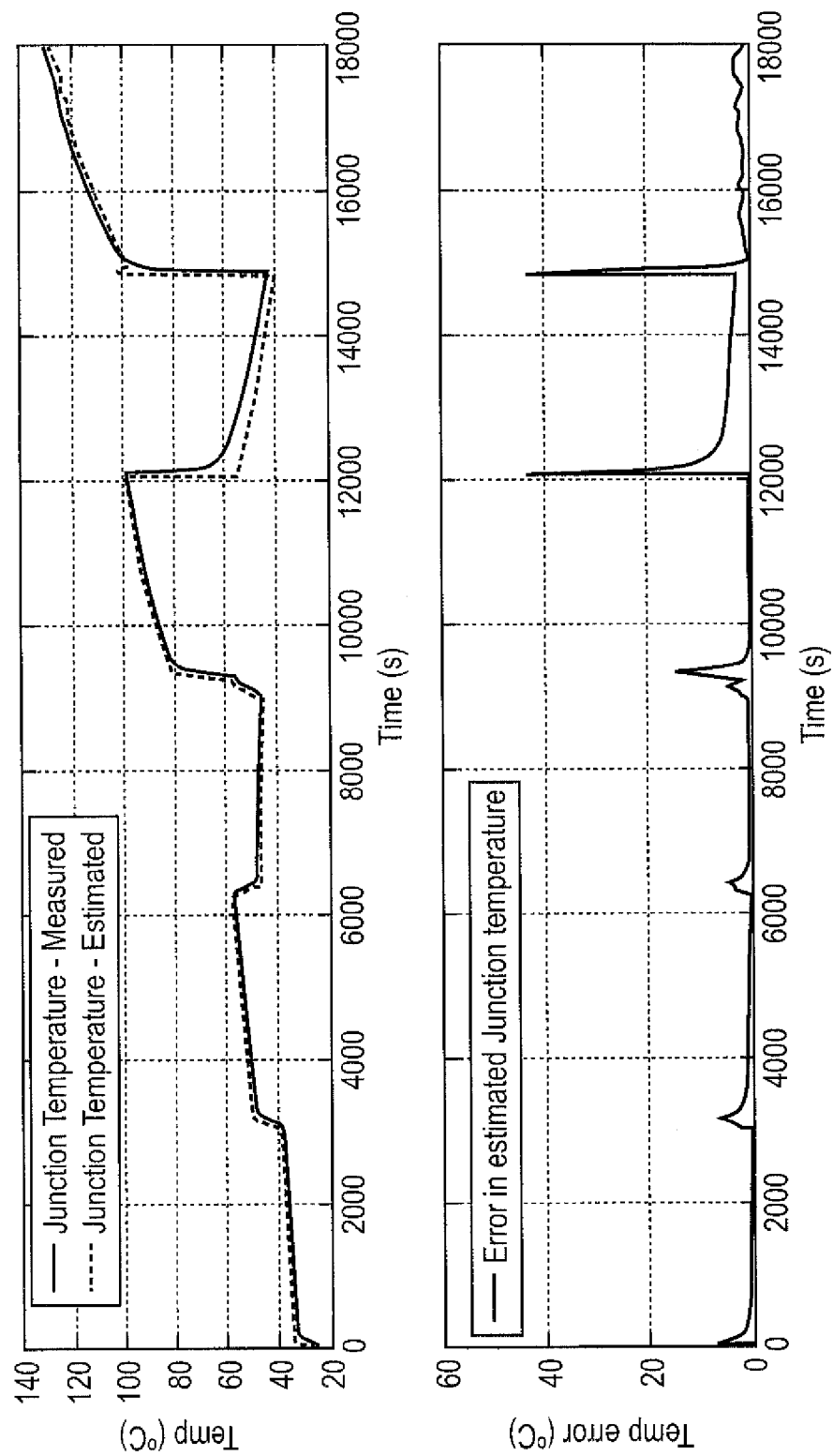
FIG. 5 shows typical estimated and measured junction temperatures for the thermal controller of FIG. 1.

The performance of the dynamic thermal model has been experimentally verified by installing a calibrated thermocouple to the gate junction of a typical switching device 150. FIG. 5 shows the correlation between the estimated and measured gate junction temperatures under both steady state and dynamic load profile.

Figure 2:
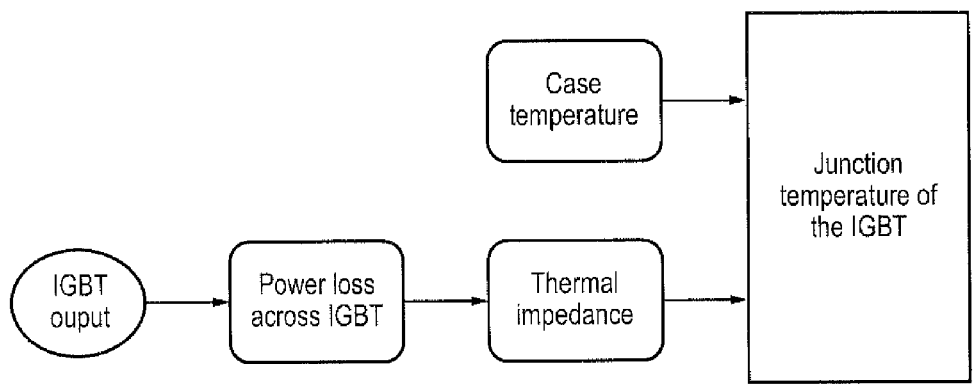
FIG. 2 is a schematic depiction of the junction temperature estimation of the thermal controller of FIG. 1.

In use, the operational mode of the thermal controller 100 of the invention is determined by the estimated junction temperature, as shown in FIG. 2. When the estimated junction temperature is less than $T_1$, the thermal controller 100 allows the switching device 150 to operate as normal.

When the estimated gate junction temperature exceeds $T_1$ but is less than an over-temperature limit $T_2$, the thermal controller 100 is activated and operates in an over-temperature mode. In this mode, the thermal controller 100 operates to reduce the estimated junction temperature by modifying the gate voltage, frequency and the duty cycle to actively control the estimated junction temperature.

If the estimated junction temperature continues to increase and exceeds a shutdown temperature limit $T_3$ (typically approximately 150° C.), the thermal controller 100 enters a shutdown mode which causes the switching device 150 to switch off. The shutdown mode is included to protect the switching device 150 from excessive over temperature should the thermal controller 100 fail to control the switching device gate junction temperature. Under such circumstances, the gate driver 160 is designed to softly shutdown the power device, by decreasing the gate voltage.

Figure 3:
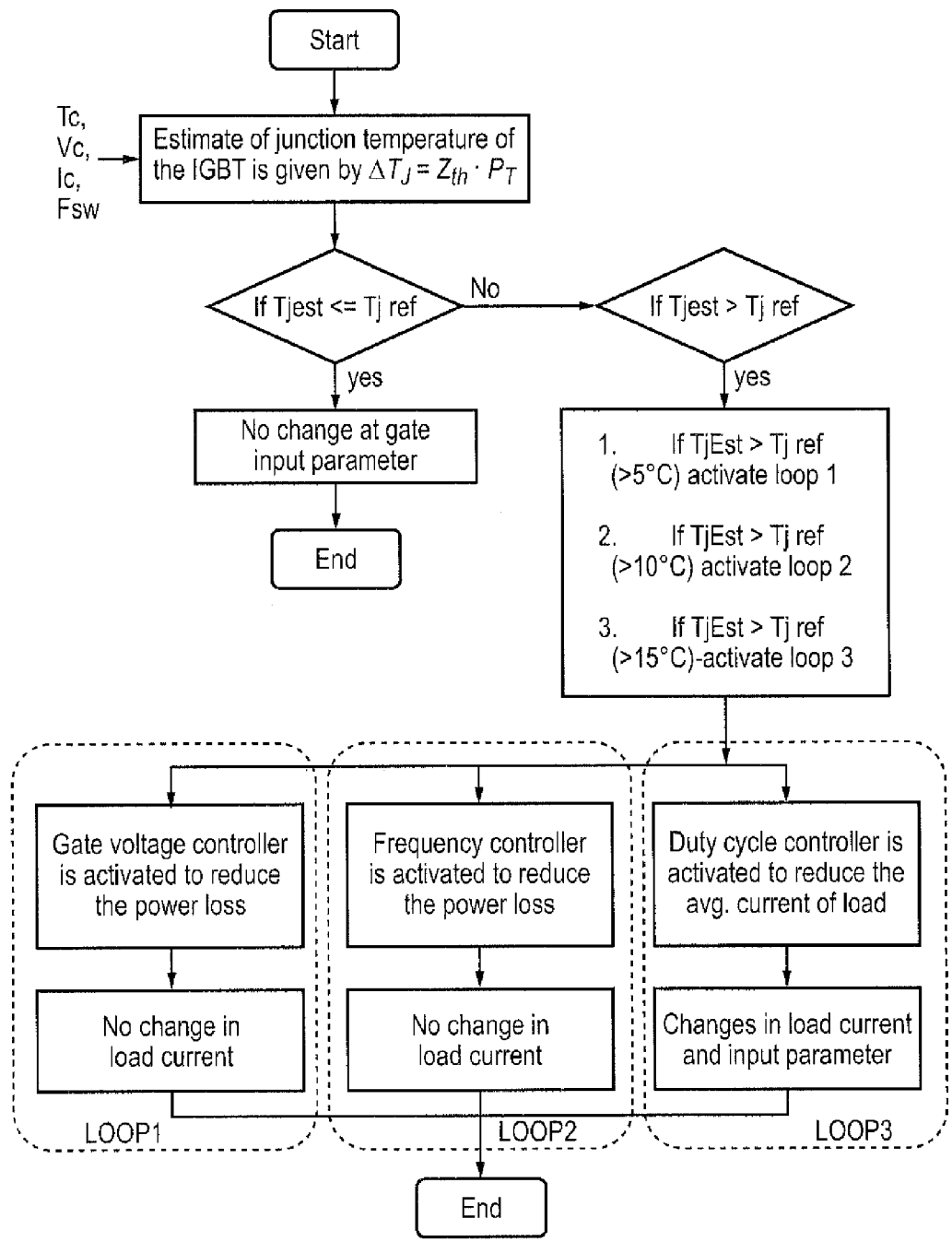
FIG. 3 shows a flow chart showing the operating characteristics of the thermal controller of FIG. 1.
Figure 4:
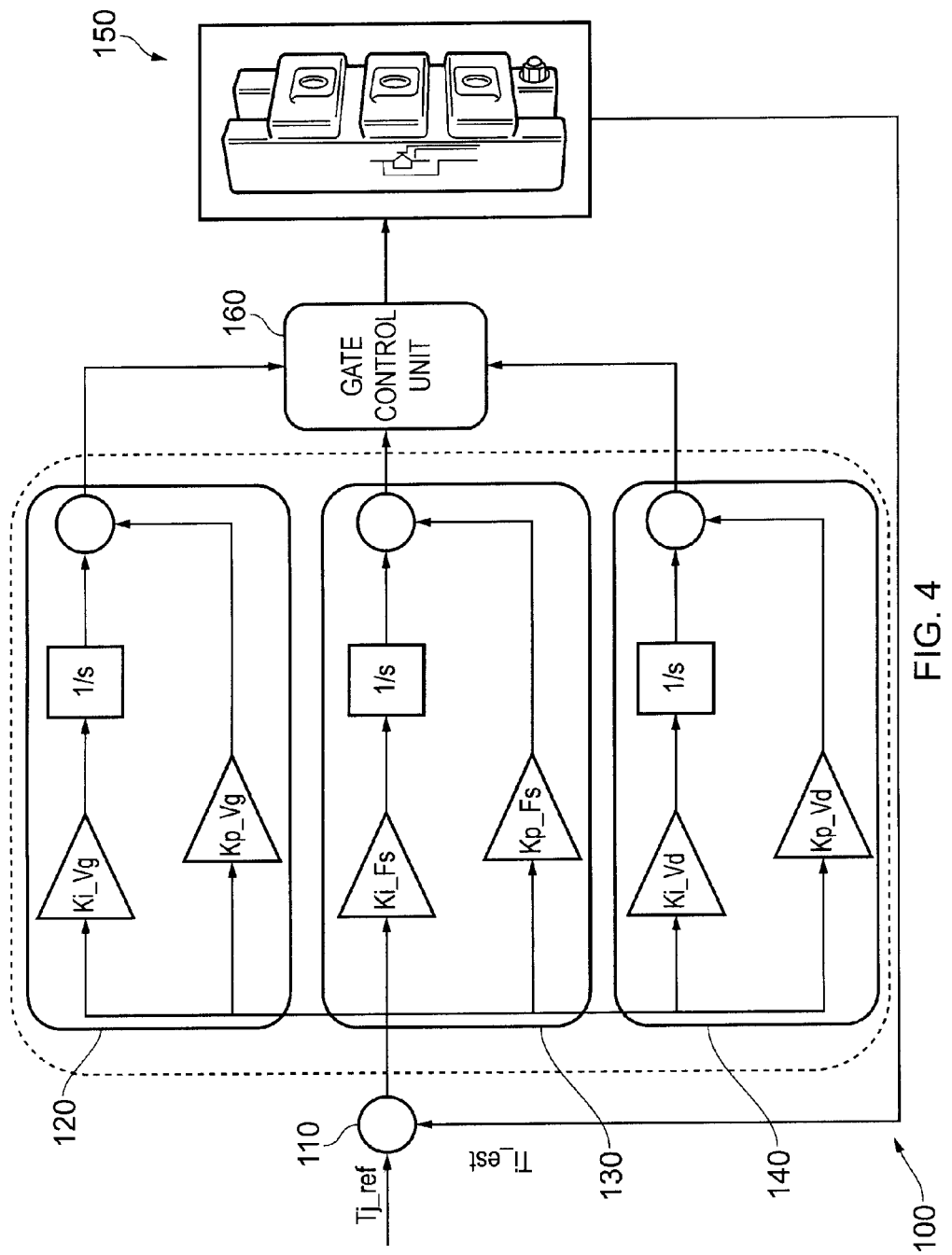
FIG. 4 shows a block diagram of the thermal controller of FIG. 1.

The proposed thermal controller 100 is activated once the junction temperature enters the over temperature region. FIG. 3 shows a flow chart of the thermal controller 100, in which the estimated junction temperature to select activation of appropriate control. A block diagram of the complete thermal controller 100 is shown in FIG. 4. For simplicity, the selection of the control activation follows a hierarchy process by first initiating gate voltage control, followed by switching frequency control and finally the duty cycle control for minimum impact on system performance.

Figure 6A:
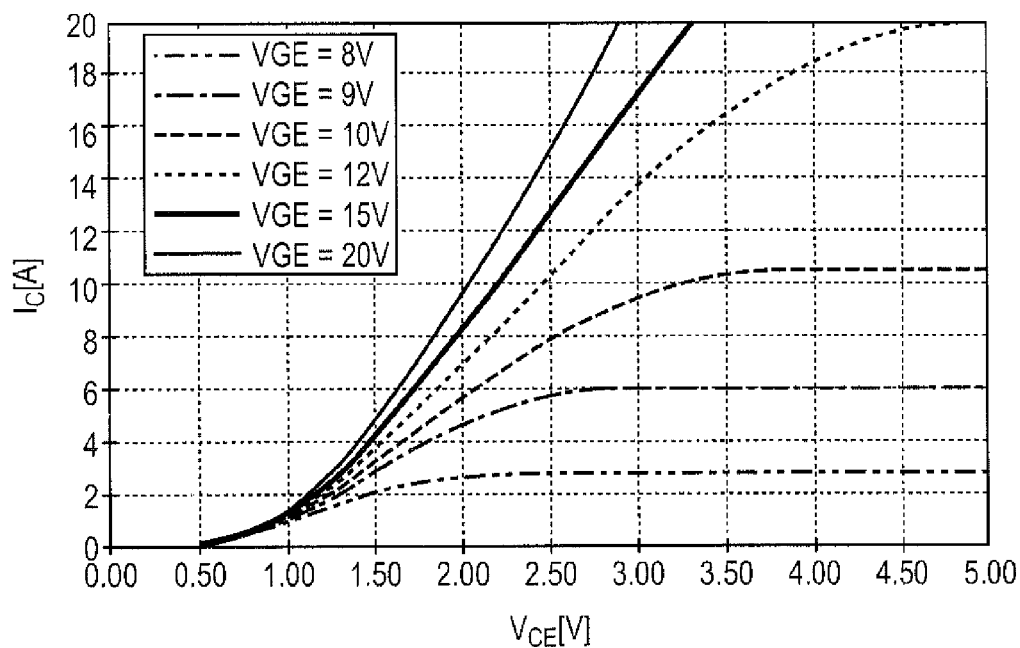
FIG. 6A shows a typical characteristic of device current and collector-emitter voltage at different gate-emitter voltage which may be used to calculate part of conduction power loss for the thermal controller of FIG. 1.
Figure 6B:
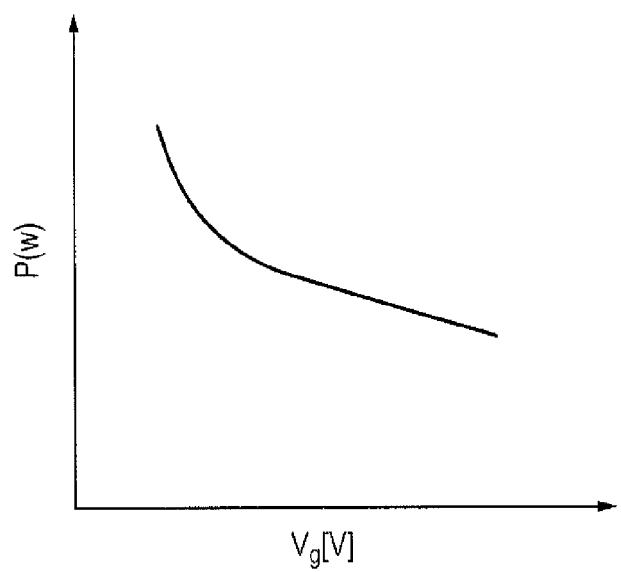
FIG. 6B shows the relationship between gate voltage and power loss for the thermal controller of FIG. 1.

When the gate voltage is increased, there is a corresponding decrease in the voltage across the switching device 150 when conducting (see FIG. 6A). This leads to a reduction in the conduction power loss, as shown in FIG. 6B. Thus the thermal controller 100 uses the gate voltage for primary control of the conduction power loss and thereby the estimated junction temperature.

Figure 7:
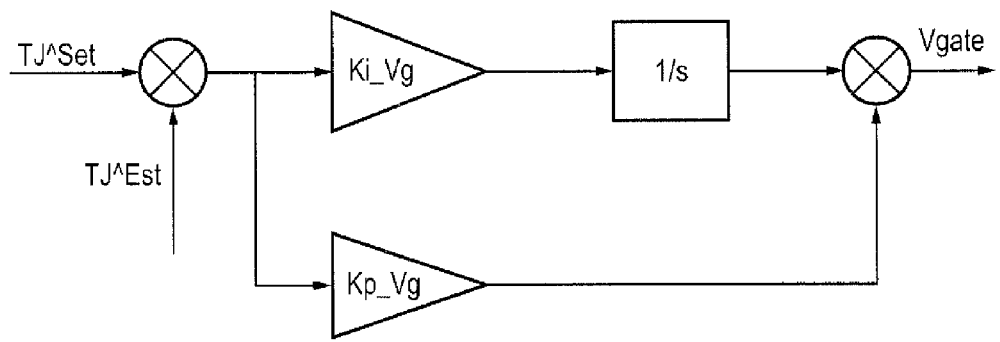
FIG. 7 shows a schematic arrangement of the gate voltage control module of the thermal controller of FIG. 1.

In the present embodiment, the gate voltage control module 120 uses a closed loop controller using a simple proportional-integral (PI) arrangement to control the error between the reference junction temperature and the estimated junction temperature, as shown in FIG. 7. If the estimated junction temperature enters into the over temperature region, the thermal controller 100 will first activate the gate voltage control module 120 as shown in the control flow diagram in FIG. 3. This action results in minimum impact on the system performance.

Generally, the gate voltage can be safely varied between 10 and 18 volts. As a standard practice a value of 15 volts is used. During the voltage change, the device current is kept constant.

Figure 8:
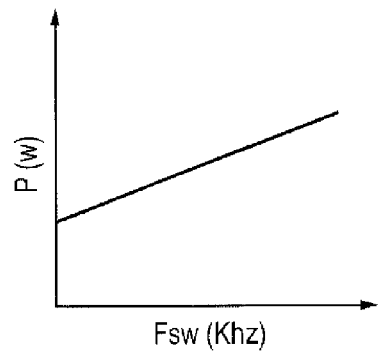
FIG. 8 shows the relationship between switching frequency and power loss for the thermal controller of FIG. 1.

The thermal controller 100 uses the switching frequency of the switching device 150 as a secondary control of the switching power loss and thereby the estimated junction temperature. As shown in FIG. 8 it is seen that power loss increases with an increase in the switching frequency. It is also known that such switching loss is a frequency dependent component. Hence, when designing the power converter, the switching frequency is set to an optimum value to minimise the switching ripple and minimise the power loss, from which the filter inductors and heat sink are appropriately sized.

The thermal controller 100 actively reduces the switching frequency when the switching device 150 enters the over-temperature mode of operation (see FIG. 1). This reduction in the switching frequency will reduce the power loss in the switching device 150 which in turn leads to a reduction in junction temperature.

Figure 9:
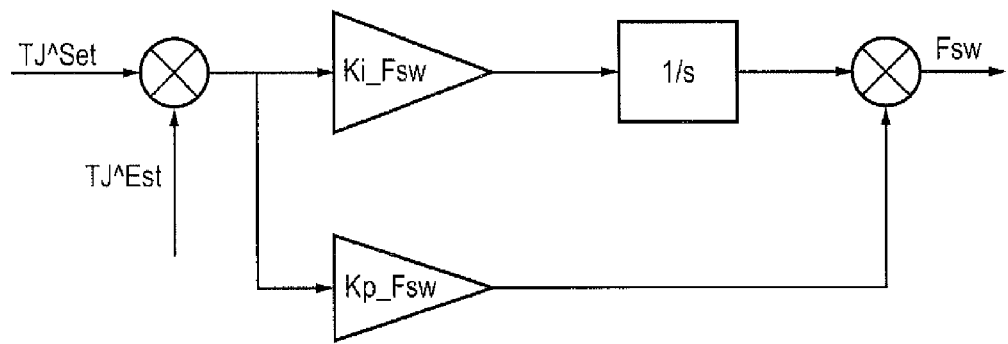
FIG. 9 shows a schematic arrangement of the switching frequency control module of the thermal controller of FIG. 1.

In the present embodiment, the switching frequency control module 130 uses a closed loop controller (as shown in FIG. 9), where the reference junction temperature is compared with an estimated junction temperature. The switching frequency control module 130 is activated once the threshold reference is reached as shown by the flow chart in FIG. 3.

Figure 10:
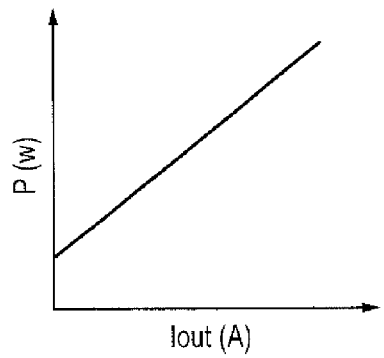
FIG. 10 shows the relationship between output current and power loss for the thermal controller of FIG. 1.

In addition to gate voltage and switching frequency, the conduction power loss is also dependent upon the duty cycle of the switching device, as shown in FIG. 10, which shows that power loss is reduced when the duty cycle is reduced. Furthermore, reducing the duty cycle will also reduce the device current drawn by the load which results in a reduction in the overall power losses of the system.

In a similar manner to that described above for the gate voltage and the switching frequency, the duty cycle control module 140 operates by first comparing the reference junction temperature with the estimated junction temperature.

Provided the estimated junction temperature is greater than $T_2$ and less than $T_3$, and the gate voltage control module 120 and switching frequency control module 130 have been unable to reduce the estimated junction temperature, the duty cycle control module 140 is enabled.

Figure 11:
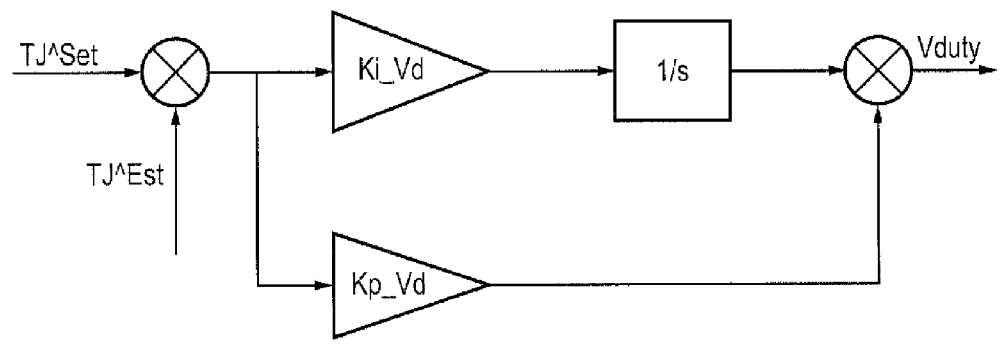
FIG. 11 shows a schematic arrangement of the duty cycle control module of the thermal controller of FIG. 1.

The duty cycle control module 140 uses a simple proportional (PI) controller to control the duty cycle, as shown in FIG. 11. In the present embodiment, the duty cycle control module 140 uses junction temperature control as an inner control loop, which provides for a rapid response time. It is noted that such a control architecture may disturb the control and stability of the high level controller. To prevent this scenario, the high level control references are delayed to prevent hunting or fighting between the control modules. The duty cycle control module 140 will activate only once the switching frequency control module 130 is saturated and when the estimated junction temperature reaches the $T_1$ temperature, as described in flow chart given by FIG. 3.

There may be circumstances, for example due to a component failure, in which the thermal controller 100 saturates and the junction temperature of the switching device 150 cannot be controlled to a required pre-determined limit and so continues to increase. In such circumstances a safe shutdown of the power module is required.

Figure 12:
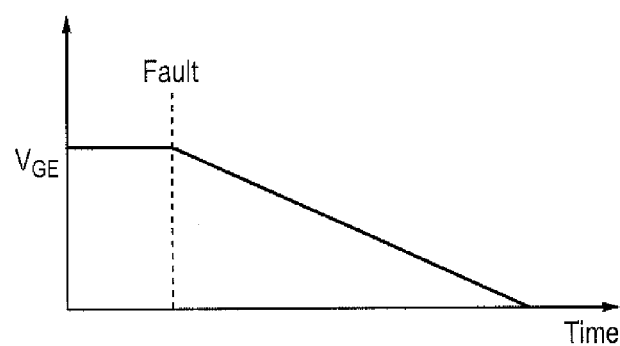
FIG. 12 shows a typical gate voltage characteristic for the thermal controller of FIG. 1 when operating in a shutdown mode.
Figure 13:
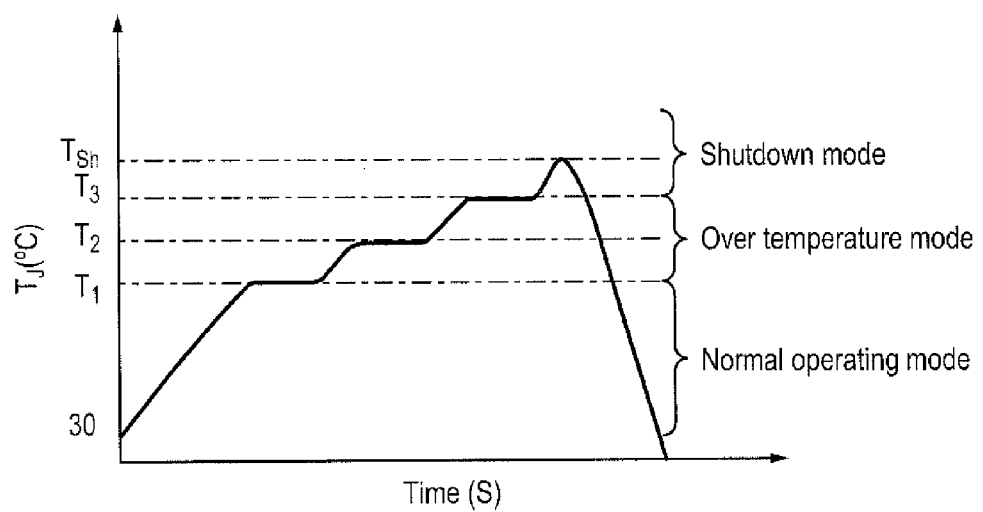
FIG. 13 shows a typical junction temperature characteristic for the thermal controller of FIG. 1 when operating in a shutdown mode.

In the present embodiment, the thermal controller 100 is able to safely shutdown the power module by controlling the gate voltage. Such a technique results in minimal electrical stress to the power module in terms of the rate of change of voltage and rate of change of current. FIG. 12 shows an example of the variation in the gate voltage resulting from such a shutdown procedure, with a typical temperature profile being shown in FIG. 13.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person of skill in the art are included within the scope of the invention as defined by the accompanying claims.

What is claimed is:

1. A method of controlling an operating characteristic of a switching device, the method comprising the steps of:
   transmitting a drive signal to a gate of the switching device to thereby operate the switching device;
   measuring at least one parameter that is representative of an operating condition of the switching device, wherein the measuring comprises measuring a collector-emitter voltage, a supply current, a switching frequency and a case temperature of the switching device;
   using the at least one parameter to generate at least one control signal, wherein the using comprises
      generating a calculated junction temperature for the switching device from the measured collector-emitter voltage, supply current, switching frequency and case temperature of the switching device, and
      generating a first control signal if the calculated junction temperature of the switching device is higher than a first reference temperature and lower than a second reference temperature; generating a second control signal if the calculated junction temperature of the switching device is higher than the second reference temperature and lower than a third reference temperature; and generating a third control signal if the calculated junction temperature of the switching device is higher than the third reference temperature; and
   controlling the operating characteristic of the switching device by modifying the drive signal in response to the at least one control signal.

2. The method as claimed in claim 1, wherein:
   controlling the operating characteristic of the switching device by modifying the drive signal in response to the at least one control signal comprises:
      activating a gate voltage controller to reduce the power loss in the switching device in response to the first control signal;
      activating a frequency controller to reduce the power loss in the switching device in response to the second control signal; and
      activating a duty cycle controller to reduce the average current supplied to the switching device in response to the third control signal.

* * * * *